US011870001B2

United States Patent
Lee et al.

(10) Patent No.: US 11,870,001 B2
(45) Date of Patent: Jan. 9, 2024

(54) SEMICONDUCTOR NANOPARTICLES, ELECTRONIC DEVICE INCLUDING THE SAME, AND METHOD FOR MANUFACTURING SEMICONDUCTOR NANOPARTICLES

(71) Applicants: Samsung Display Co., Ltd., Yongin-si (KR); Research & Business Foundation Sungkyunkwan University, Suwon-si (KR)

(72) Inventors: Sooho Lee, Yongin-si (KR); Minki Nam, Yongin-si (KR); Sungwoon Kim, Yongin-si (KR); Jeongwoo Park, Suwon-si (KR); Wanki Bae, Suwon-si (KR); Changhee Lee, Yongin-si (KR); Byeongguk Jeong, Suwon-si (KR)

(73) Assignees: Samsung Display Co., Ltd., Yongin-si (KR); Research & Business Foundation Sungkyunkwan University, Suwon-si (KR)

( * ) Notice: Subject to any disclaimer, the term of this patent is extended or adjusted under 35 U.S.C. 154(b) by 143 days.

(21) Appl. No.: 17/443,402

(22) Filed: Jul. 26, 2021

(65) Prior Publication Data
US 2022/0149223 A1 May 12, 2022

(30) Foreign Application Priority Data
Nov. 6, 2020 (KR) ........................ 10-2020-0148132

(51) Int. Cl.
*H01L 31/12* (2006.01)
*H01L 31/0384* (2006.01)
(Continued)

(52) U.S. Cl.
CPC ...... *H01L 31/125* (2013.01); *H01L 31/03845* (2013.01); *H01L 31/1032* (2013.01);
(Continued)

(58) Field of Classification Search
CPC ............. H01L 31/125; H01L 31/03845; H01L 31/1032; H01L 31/1035; H01L 31/1828;
(Continued)

(56) References Cited

U.S. PATENT DOCUMENTS

2004/0075388 A1* 4/2004 Miyashita ................ H01J 11/40
313/586
2010/0140586 A1* 6/2010 Char .................... C09K 11/883
257/14
(Continued)

FOREIGN PATENT DOCUMENTS

CN         110317609 A  * 10/2019  ............. B82Y 20/00
KR         10-1246618 B1    3/2013
WO         WO 2015/172019 A1  11/2015

OTHER PUBLICATIONS

Zakarian, U.C. Santa Barbara, "bond dissociation energy" [retrieved on Jun. 10, 2023] Retrieved from using Internet <URL: https://labs.chem.ucsb.edu/zakarian/armen/11---bonddissociationenergy.pdf>.*
(Continued)

*Primary Examiner* — Sitaramarao S Yechuri
(74) *Attorney, Agent, or Firm* — Lewis Roca Rothgerber Christie LLP

(57) ABSTRACT

An electronic device includes a semiconductor nanoparticle, and a method of manufacturing the semiconductor nanoparticle is additionally provided. The semiconductor nanoparticle includes: a core including a first element; and a shell covering at least a portion of a surface of the core and including a second element and a third element, wherein the first element, the second element, and the third element are different from each other, and the first element and the second element are chemically bonded to each other on the at least a portion of the surface of the core.

20 Claims, 6 Drawing Sheets

(51) Int. Cl.
*H01L 31/103* (2006.01)
*H01L 31/18* (2006.01)
*H10K 50/115* (2023.01)
*H10K 59/60* (2023.01)
*H10K 71/00* (2023.01)
*B82Y 40/00* (2011.01)
*B82Y 20/00* (2011.01)

(52) U.S. Cl.
CPC ........ *H01L 31/1035* (2013.01); *H01L 31/184* (2013.01); *H01L 31/1828* (2013.01); *H10K 50/115* (2023.02); *H10K 59/60* (2023.02); *H10K 71/00* (2023.02); *B82Y 20/00* (2013.01); *B82Y 40/00* (2013.01)

(58) Field of Classification Search
CPC ........... H01L 31/184; H01L 2933/0041; H01L 2933/0091; H01L 33/505; H01L 33/502; H01L 33/06; H01L 33/50; H10K 50/115; H10K 59/60; H10K 71/00; B82Y 20/00; B82Y 40/00; B82Y 30/00; Y02P 70/50; C09K 11/88; C09K 11/02; C09K 11/025; C09K 11/70; C09K 11/883
See application file for complete search history.

(56) References Cited

U.S. PATENT DOCUMENTS

| | | | |
|---|---|---|---|
| 2014/0264196 A1* | 9/2014 | Werner | C23C 16/30 977/774 |
| 2014/0346442 A1* | 11/2014 | Nag | B01J 13/0034 257/29 |
| 2015/0300600 A1 | 10/2015 | Dubrow et al. | |
| 2017/0271604 A1 | 9/2017 | Brown et al. | |
| 2017/0306227 A1* | 10/2017 | Ippen | C09K 11/02 |
| 2017/0309798 A1* | 10/2017 | Bonar | H01L 33/22 |
| 2017/0373266 A1* | 12/2017 | Xu | H10K 50/115 |
| 2018/0033856 A1* | 2/2018 | Kwon | H01L 29/0665 |

OTHER PUBLICATIONS

Brown, Patrick R. et al., "Energy Level Modification in Lead Sulfide Quantum Dot Thin Films through Ligand Exchange," *ACS Nano*, 2014, 8(6), pp. 5863-5872.

Chuang, Chia-Hao M. et al, "Improved performance and stability in quantum dot solar cells through band alignment engineering," *Nature Materials*, 2014, 13, pp. 796-801.

Kroupa, Daniel M. et al., "Tuning colloidal quantum dot band edge positions through solution-phase surface chemistry modification," *Nature Communications*, May 2017, 8, 15257, 8pp.

Milliron, Delia J. et al, "The surface plays a core role," *Nature Materials*, Aug. 2014, 13, pp. 772-773.

Schmeißer, Dieter et al., "Dipole Moment of Nanoparticles at Interfaces," *Phys. Rev. Lett.*, Jul 1999, 82(2), pp. 380-383.

Soreni-Harari, Michael et al., "Tuning Energetic Levels in Nanocrystal Quantum Dots through Surface Manipulations," *Nano Letters*, 2008, 8(2), pp. 678-684.

Xie, Renguo et al. "Synthesis of Cu-Doped InP Nanocrystals (d-dots) with ZnSe Diffusion Barrier as Efficient and Color-Tunable NIR Emitters," *J. Am. Chem. Soc.*, 2009, 131 (30), pp. 10645-10651.

* cited by examiner

- FIRST ELEMENT
- SECOND ELEMENT
- FOURTH ELEMENT

SEMICONDUCTOR NANOPARTICLES, ELECTRONIC DEVICE INCLUDING THE SAME, AND METHOD FOR MANUFACTURING SEMICONDUCTOR NANOPARTICLES

CROSS-REFERENCE TO RELATED APPLICATION

This application claims priority to and the benefit of Korean Patent Application No. 10-2020-0148132, filed on Nov. 6, 2020, in the Korean Intellectual Property Office, the entire content of which is incorporated herein by reference.

BACKGROUND

1. Field

One or more aspects of embodiments of the present disclosure relate to semiconductor nanoparticles, electronic devices including the same, and methods of manufacturing the semiconductor nanoparticles.

2. Description of Related Art

Semiconductor nanoparticles are crystalline materials with a size of several nanometers, which exhibit quantum confinement effects, and may also be referred to as quantum dots.

Semiconductor nanoparticles may receive light (e.g., a first light wave) from an excitation source and thus enter an excited state, and thereafter emit energy (e.g., light or a second light wave) corresponding to an energy band gap of the semiconductor nanoparticles. Semiconductor nanoparticles exhibit characteristics such as excellent or suitable color purity and high luminous efficiency, and accordingly, can be utilized in various suitable applications. For example, semiconductor nanoparticles may be utilized in lighting devices, display devices, and/or the like.

SUMMARY

One or more aspects of embodiments of the present disclosure are directed toward semiconductor nanoparticles, electronic devices including the same, and methods of manufacturing the semiconductor nanoparticles. For example, provided are semiconductor nanoparticles in which the energy level (e.g., band gap) is controlled or selected by adjusting the interface characteristics between the core and the shell, electronic devices including the same, and methods of manufacturing the semiconductor nanoparticles.

Additional aspects will be set forth in part in the description that follows and, in part, will be apparent from the description, or may be learned by practice of the presented embodiments of the disclosure.

One or more embodiments of the present disclosure provide a semiconductor nanoparticle including: a core including a first element, and a shell around (e.g., covering) at least a portion of a surface of the core and including a second element and a third element, wherein the first element, the second element, and the third element are different from each other, and the first element and the second element are chemically bonded to each other on the at least a portion of the surface of the core (e.g., across the interface between the core and the shell).

In an embodiment, the shell may include a first region and a second region, where the first region is between the core and the second region, and an atom % of the third element in the first region is less than an atom % of the third element in the second region.

In an embodiment, the core may further include a fourth element, and the first element may be present without a chemical bond to the fourth element (e.g., the first element and the fourth element may not be chemically bonded to each other, for example, may not be together in a compound).

In an embodiment, an atomic ratio of the first element to the fourth element (calculated utilizing the equation of {the number of atoms of the first element/the number of atoms of the fourth element}) may be 0.5 to 2.0.

In an embodiment, the core may include a third region and a fourth region, where the third region is between the shell and the fourth region, and an atom % of the first element in the third region is greater than the atom % of the first element in the fourth region.

In an embodiment, the absolute value of the oxidation number of the first element may be different from the absolute value of the oxidation number of the second element (e.g., the absolute values may be different from each other).

In an embodiment, one selected from the oxidation number of the first element and the oxidation number of the second element may be a negative value, and the other may be a positive value.

In an embodiment, the first element and the second element may each independently be a Group 12 element, a Group 13 element, a Group 14 element, a Group 15 element, or a Group 16 element.

In an embodiment, the chemical bond (e.g., between the first element and the second element) may be a chemical bond of (e.g., between) a Group 12 element and a Group 16 element, a chemical bond of a Group 13 element and a Group 15 element, a chemical bond of a Group 13 element and a Group 16 element, a chemical bond of a Group 14 element and a Group 12 element, a chemical bond of a Group 14 element and a Group 13 element, a chemical bond of a Group 14 element and a Group 16 element, a chemical bond of a Group 14 element and a Group 15 element, or a combination thereof. For example, the first element and the second element may be a Group 12 element and a Group 16 element or vice versa, a Group 13 element and a Group 16 element or vice versa, a Group 14 element and a Group 16 element or vice versa, a Group 13 element and a Group 15 element or vice versa, a Group 14 element and a Group 15 element or vice versa, a Group 12 element and a Group 14 element or vice versa, or a Group 13 element and a Group 14 element or vice versa.

In an embodiment, the core may include InP, the shell may include ZnSe, and the chemical bond between the first element and the second element may be a chemical bond of In and Se. For example, the first element may be In and the second element may be Se.

In an embodiment, a band gap of the core may be about 1.35 eV to about 3.10 eV, and a band gap of the shell may be about 1.1 eV to about 3.68 eV.

One or more embodiments of the present disclosure provide an electronic device including the semiconductor nanoparticle; and a light-emitting device including: a first electrode, a second electrode, and an interlayer located between the first electrode and the second electrode.

In an embodiment, the electronic device may further include a first substrate, wherein the first substrate includes the semiconductor nanoparticle.

In an embodiment, one region (e.g. a first region) of the first substrate may include the semiconductor nanoparticle, and the semiconductor nanoparticle may be to absorb first-color light and emit second-color light.

In an embodiment, the first substrate may further include another region (e.g. a second region) that is distinct from the first region, and the other region (e.g. second region) includes a scattering body, but does not contain the semiconductor nanoparticle.

In an embodiment, the first substrate may be positioned on the light-emitting device in a travel direction of light emitted from the light-emitting device (e.g., so that the light emitted from the light-emitting device is incident on the substrate).

In an embodiment, the interlayer may include the semiconductor nanoparticle.

In an embodiment, when an electric field is applied between the first electrode and the second electrode, the semiconductor nanoparticles may be to emit visible light.

One or more embodiments of the present disclosure provide a method of manufacturing a semiconductor nanoparticle, the method including: providing a core including the first element; forming a chemical bond between the first element and a second element by adding a first precursor including the second element; and forming a shell including the second element and a third element to cover at least a portion of a surface of the core by adding a second precursor including the third element, wherein the first element, the second element, and the third element are different from each other.

In an embodiment, the core may further include a fourth element, and the first element may be present without a chemical bond with the fourth element.

BRIEF DESCRIPTION OF THE DRAWINGS

The above and other aspects, features, and advantages of selected embodiments of the disclosure will be more apparent from the following description taken in conjunction with the accompanying drawings, in which.

DETAILED DESCRIPTION

Figure 1:
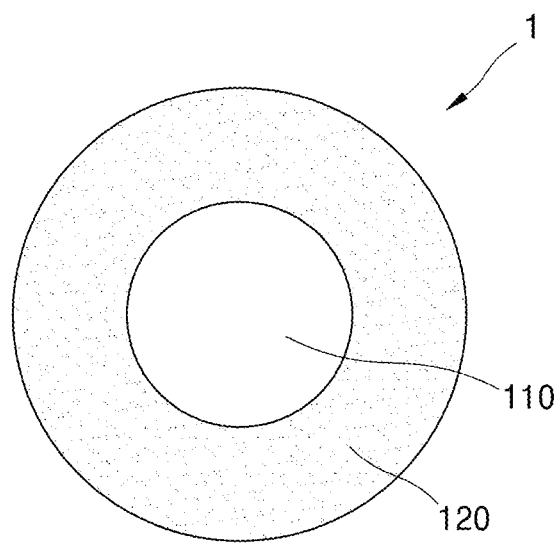
FIG. 1 schematically illustrates a structure of a semiconductor nanoparticle according to an embodiment.

Reference will now be made in more detail to embodiments, examples of which are illustrated in the accompanying drawings. In this regard, the present embodiments may have different forms and should not be construed as being limited to the descriptions set forth herein. Accordingly, the embodiments are merely described, by referring to the drawings, to explain aspects of the present description. As utilized herein, the term "and/or" includes any and all combinations of one or more of the associated listed items.

Throughout the disclosure, the expression "at least one of a, b or c" may indicate only a, only b, only c, both (e.g., simultaneously) a and b, both (e.g., simultaneously) a and c, both (e.g., simultaneously) b and c, all of a, b, and c, or variations thereof. Further, expressions such as "at least one of," "one of," and "selected from," when preceding a list of elements, modify the entire list of elements and do not modify the individual elements of the list.

Because the present disclosure may have various suitable modifications and examples, selected examples are illustrated in the drawings and will be described in more detail in the detailed description. The effects and features of the present disclosure, and methods of achieving the same, will become clear by referring to the Examples described in detail in connection with the drawings. However, the present disclosure is not limited to the disclosed embodiments, and may be implemented in various other forms.

It will be understood that although the terms "first," "second," etc. utilized herein may be utilized herein to describe one or more suitable components, these components should not be limited by these terms. These components are only utilized to distinguish one component from another.

An expression utilized in the singular encompasses the expression of the plural, unless it has a clearly different meaning in the context. As used herein, the singular forms "a," "an," and "the" are intended to include the plural forms as well, unless the context clearly indicates otherwise.

It will be further understood that the terms "includes" and/or "comprises" utilized herein specify the presence of stated features or components, but do not preclude the presence or addition of one or more other features or components. For example, terms such as "comprise," "include," and/or "have" may refer to both a case consisting of only features or components described in the specification, and a case further including other components, unless limited otherwise.

Like reference numerals in the drawings refer to like components, and duplicative descriptions thereof may not be provided. Dimensions and sizes of each component in the drawings may be exaggerated or reduced for clarity and convenience of description.

When a portion of a layer, film, region, plate, etc. is said to be "on" another portion, this includes not only the case in which the portion is "directly on" another portion, but also the case in which an intervening layer is placed therebetween. When a portion is placed "directly on" the other portion, this means that there is no intervening layer.

The term "maximum luminescence wavelength" utilized herein refers to a wavelength value corresponding to a point having a maximum emission intensity in a photoluminescence (PL) spectrum of a solution or film sample of a compound.

The term "full width at half maximum (FWHM)" utilized herein refers to the wavelength width at a height (intensity) corresponding to one-half of the maximum luminous intensity in the PL spectrum described above.

The term "Group" utilized herein refers to a group on the IUPAC Periodic Table of Elements.

The term "average diameter" utilized herein refers to the average value of diameters measured from all semiconductor nanoparticles included in an arbitrary sample.

The term "average thickness" utilized herein refers to the average value of a thickness measured (e.g., for a shell) from all semiconductor nanoparticles included in an arbitrary sample.

The term "Groups 12-16 compounds" may refer to a compound formed of two or more Group 12-16 elements, and may include: a binary compound selected from CdS, CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; a quaternary compound selected from CdZnSeS, CdZnSeTe, CdZnSTe, CdHgSeS, CdHgSeTe, CdHgSTe, HgZnSeS, HgZnSeTe, HgZnSTe, and any mixture thereof; or a combination thereof.

The term "Groups 13-16 compounds" may refer to a compound formed of two or more Group 13-16 elements, and may include: a binary compound selected from $In_2S_3$, $In_2Se_3$ and any mixture thereof; a ternary compound selected from $InGaS_3$, $InGaSe_3$ and any mixture thereof; or a combination thereof. In some embodiments, the Groups 13-16 compounds may further include a Group 11 element. For example, the Groups 13-16 compounds may include: a ternary compound selected from AgInS, $AgInS_2$, CuInS, $CuInS_2$, $CuGaO_2$, $AgGaO_2$, $AgAlO_2$, and any mixture thereof; or a combination thereof.

The term "Groups 13-15 compounds" may refer to a compound formed of two or more Group 13-15 elements, and may include: a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and any mixture thereof; a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof; or a combination thereof. In some embodiments, the Group 13-15 semiconductor compounds may further include a Group 12 element, for example, InZnP.

The term "Groups 14-16 compounds" may refer to a compound formed of two or more Group 14-16 elements, and, utilized herein, may include: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; a quaternary compound selected from SnPbSSe, SnPbSeTe, SnPbSTe, and any mixture thereof; or a combination thereof.

The term "Group 14 element or compound" as utilized herein may include: a single element compound selected from Si, Ge, and any mixture thereof; a binary compound selected from SiC, SiGe, and any mixture thereof; or a combination thereof.

The binary compound, the ternary compound, or the quaternary compound, as described and utilized herein, may each exist in particles at substantially uniform concentrations (e.g., distributions), or may exist in the same particle in which a concentration distribution is partially different (e.g., may be present in a non-uniform concentration or distribution, for example in a gradient).

Figure 2:
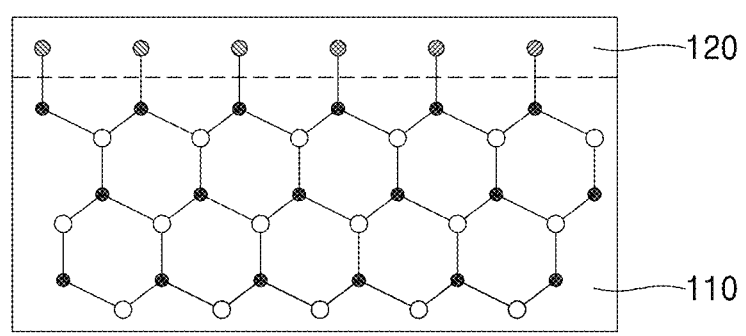
FIG. 2 is an enlarged view of a portion of FIG. 1.

Hereinafter, a semiconductor nanoparticle 1 according to an embodiment of present disclosure will be described with reference to FIGS. 1 and 2.

The semiconductor nanoparticle 1 may include a core 110 including a first element, and a shell 120 covering at least one portion of the surface of the core 110 and including a second element and a third element.

In the semiconductor nanoparticle 1, a chemical bond is formed between the first element (e.g., in the core) and the second element (e.g., in the shell) on at least one portion of the surface of the core 110. Accordingly, the obtained semiconductor nanoparticle may have an energy level (e.g., a conduction band level and/or a valence band level) that is different from (e.g., modified with respect to) that of semiconductor nanoparticles in which an element included in the core 110 does not form a chemical bond with an element included in the shell 120. Because the energy levels of semiconductor nanoparticles can be easily changed through this energy-level control method, one or more suitable materials can be selected to implement an electronic device including the same. In some embodiments, because the energy level of the semiconductor nanoparticle 1 is controlled or selected not by adjusting the characteristics of the outermost surface of the semiconductor nanoparticle 1, but by controlling the characteristics of the interface between the core 110 and the shell 120 within (e.g., inside) the semiconductor nanoparticle 1, the energy level of the semiconductor nanoparticle 1 may not change substantially depending on the surrounding environment and/or time (e.g., may exhibit reduced or substantially no drift over its lifetime).

In an embodiment, results obtained by comparing the semiconductor nanoparticle 1, in which the first element and the second element form a chemical bond, with a semiconductor nanoparticle 1', in which the first element and the second element do not form a chemical bond, are as follows:

i) In an embodiment, the conduction band minimum (CBM) of the semiconductor nanoparticle 1 may be different from the CBM of the semiconductor nanoparticle 1', and the difference therebetween may be 0.4 eV or less. In an embodiment, the CBM of the semiconductor nanoparticle 1 may be smaller (e.g., lower) than that of semiconductor nanoparticle 1'. In an embodiment, when the cores of the semiconductor nanoparticle 1 and the semiconductor nanoparticle 1' each include InP, the CBM of the semiconductor nanoparticle 1 may be −4.2 eV, and the CBM of the semiconductor nanoparticle 1' may be −3.8 eV.

ii) In an embodiment, the valence band maximum (VBM) of the semiconductor nanoparticle 1 may be different from the VBM of the semiconductor nanoparticle 1', and the difference therebetween may be 0.4 eV or less. In an embodiment, the VBM of the semiconductor nanoparticle 1 may be smaller (e.g., lower) than the VBM of the semiconductor nanoparticle 1'. In an embodiment, when the cores of the semiconductor nanoparticle 1 and the semiconductor nanoparticle 1' each include InP, the VBM of the semiconductor nanoparticle 1 may be −6.1 eV, and the VBM of the semiconductor nanoparticle 1' may be −5.7 eV.

The first element, the second element and the third element may be different from each other (e.g., may be different elements), and the first element and the second element may be chemically bonded on at least one portion of the surface of the core 110. Accordingly, a dipole moment occurs (e.g., may be formed) at the interface between the core 110 and the shell 120.

In an embodiment, the shell 120 may include a first region and a second region, the first region may be positioned between the core 110 and the second region, and an atom % (e.g., atomic concentration) of the third element in the first region may be smaller than the atom % of the third element in the second region.

In an embodiment, the shell 120 may be a single layer or have multiple layers, and the interface between the core 110 and the shell 120 may have a concentration gradient in which the concentration of an element present in the shell 120 decreases toward (e.g., closer to) the center of the core.

In an embodiment, the core 110 may further include a fourth element, and the first element is not chemically bonded to the fourth element.

In an embodiment, the atomic ratio of the first element to the fourth element, which is calculated by the equation {number of atoms of the first element/number of atoms of the fourth element} in the core 110 may be from 0.5 to 2.0. In an embodiment, the atomic ratio of the first element to the fourth element, which is calculated by the equation {number of atoms of the first element/number of atoms of the fourth element} in the core 110 may be 0.7 or more, 1.5 or less, 1.2 or less, or 0.9 or less.

In an embodiment, the core 110 may include a third region and a fourth region, the third region may be positioned between the shell 120 and the fourth region, and the atom % of the first element in the third region may be greater than the atom % of the first element in the fourth region.

In an embodiment, the absolute value of the oxidation number of the first element may be different from the absolute value of the oxidation number of the second element.

In an embodiment, the oxidation number of the first element may be different from the oxidation number of the second element, and one selected from the oxidation number of the first element and the oxidation number of the second element may be a negative value, and the other may be a positive value.

In an embodiment, the first element and the second element may each independently be a Group 12 element, a Group 13 element, a Group 14 element, a Group 15 element, or a Group 16 element.

In an embodiment, the first element and the second element may each independently be zinc (Zn), cadmium (Cd), mercury (Hg), aluminum (Al), gallium (Ga), indium (In), thallium (Tl), silicon (Si), germanium (Ge), tin (Sn), lead (Pb), nitrogen (N), phosphorus (P), arsenic (As), antimony (Sb), bismuth (Bi), oxygen (O), sulfur (S), selenium (Se), or tellurium (Te).

In an embodiment, the first element and the second element may each independently be Zn, Cd, Hg, Al, Ga, In, Si, Ge, N, P, As, Sb, O, S, Se, or Te.

In an embodiment, the first element and the second element may each be In or Se.

In an embodiment, the chemical bond (e.g., between the first element and the second element) may be a chemical bond of a Group 12 element and a Group 16 element, a chemical bond of a Group 13 element and a Group 15 element, a chemical bond of a Group 13 element and a Group 16 element, a chemical bond of a Group 14 element and a Group 12 element, a chemical bond of a Group 14 element and a Group 13 element, a chemical bond of a Group 14 element and a Group 16 element, a chemical bond of a Group 14 element and a Group 15 element, or a combination thereof.

In an embodiment, the chemical bond may be a chemical bond of a Group 13 element and a Group 16 element.

Furthermore, in an embodiment, the chemical bond may be a chemical bond of In and Se.

In an embodiment, the third element may be a Group 12 element, a Group 13 element, a Group 14 element, a Group 15 element, or a Group 16 element.

In an embodiment, the third element may be a Group 15 element.

In an embodiment, the third element may be P.

In an embodiment, the fourth element may be a Group 12 element, a Group 13 element, a Group 14 element, a Group 15 element, or a Group 16 element.

In an embodiment, the fourth element may be a Group 12 element.

In an embodiment, the fourth element may be Zn.

In an embodiment, the core 110 and the shell 120 may each independently include Groups 12-16 compounds, Groups 13-16 compounds, Groups 13-15 compounds, Groups 14-16 compounds, or a combination thereof.

In an embodiment, the core 110 may include Groups 13-15 compounds.

In an embodiment, the core 110 may include InP.

In an embodiment, the shell 120 may include Groups 12-16 compounds.

In an embodiment, the shell 120 may include ZnSe.

In an embodiment, the average diameter of the core 110 may be about 2.0 nm to about 7.0 nm, for example, 2.5 nm or more, 3 nm or more, 3.2 nm or more, 4.5 nm or less, or 4 nm or less. When the average diameter of the core 110 satisfies the above ranges, a band gap suitable for light emission may be obtained.

In an embodiment, the average thickness of the shell 120 may be about 0.25 nm to about 1.5 nm, for example, 0.3 nm or more, 0.4 nm or more, 0.5 nm or more, 1.3 nm or less, 1.2 nm or less, or 1.1 nm or less. When the average thickness of the shell 120 satisfies the above ranges, the shell 120 may act as (e.g., be) a protective layer to prevent or reduce chemical degeneration (e.g., degradation) of the core 110 to maintain its semiconductor characteristics, and/or a charging layer to impart electrophoretic characteristics to the semiconductor nanoparticle 1.

In an embodiment, the average diameter of the semiconductor nanoparticle 1 may be about 3.0 nm to about 13.0 nm. In an embodiment, the average diameter of the semiconductor nanoparticle 1 may be 4.0 nm or more, 4.5 nm or more, 5.0 nm or more, 7.0 nm or less, 6.5 nm or less, or 6.0 nm or less.

In an embodiment, the band gap of the shell 120 may be larger than that of the core 110.

In one or more embodiments, the band gap of the shell 120 may be smaller than that of the core 110.

In one or more embodiments, the shell 120 may include a first shell and a second shell; the first shell may be positioned between the core 110 and the second shell, the band gap of the first shell may be larger than the band gap of the core 110, and the band gap of the second shell may be smaller than the band gap of the first shell.

In one or more embodiments, the shell 120 may include a first shell and a second shell; the first shell may be positioned between the core 110 and the second shell, the band gap of the first shell may be smaller than the band gap of the core 110, and the band gap of the second shell may be larger than the band gap of the first shell.

In an embodiment, the band gap of the core 110 may be about 1.35 eV to about 3.10 eV, and the band gap of the shell 120 may be about 1.1 eV to about 3.68 eV. When the above conditions are satisfied, semiconductor nanoparticles having improved efficiency and stability may be provided.

In an embodiment, the semiconductor nanoparticle 1 may have a dipole moment from about −4.00 Debye to about 4.00 Debye. When this condition is satisfied, the CBM and/or VBM of semiconductor nanoparticle 1 may be adjusted to be (e.g., shifted by) greater than 0 eV to 0.4 eV.

In an embodiment, the semiconductor nanoparticle 1 may be to emit visible light.

In an embodiment, the FWHM of the semiconductor nanoparticle 1 may be 60 nm or less, for example, 55 nm or less, or 40 nm or less. When the FWHM of the emission wavelength spectrum of the semiconductor nanoparticle 1 satisfies the above-described range, color purity and color reproducibility may be excellent or suitable, and a viewing angle may be widened or improved.

In an embodiment, the shape of the semiconductor nanoparticle 1 is not particularly limited, and may be any shape that is generally utilized in the art. In some embodiments, the semiconductor nanoparticle 1 may be a spherical particle, a pyramidal particle, a multi-arm particle, a cubic nanoparticle, a nanotube particle, a nanowire particle, a nanofiber particle, or a nanoplate particle.

In an embodiment, the semiconductor nanoparticle 1 may further include other compounds in addition to the above composition.

In an embodiment, the core 110 or the shell 120 of the semiconductor nanoparticle 1 may further include Groups 12-16 compounds, Groups 13-16 compounds, Groups 13-15 compounds, Groups 14-16 compounds, a Group 14 element or compound, or a combination thereof.

In an embodiment, the shell 120 may further include a metal oxide, a non-metal oxide, a semiconductor compound, or a combination thereof.

For example, the metal or non-metal oxide may include a binary compound, (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), and/or a ternary compound, (such as $MgAl_2O_4$, $CoFe_2O_4$, $NiFe_2O_4$, and/or $CoMn_2O_4$).

In an embodiment, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like.

Hereinafter, an electronic device including the semiconductor nanoparticles described above will be described.

The electronic device may include the semiconductor nanoparticle 1 and a light-emitting device including a first electrode, a second electrode, and an interlayer located between the first electrode and the second electrode.

In an embodiment, the electronic device may be or include a liquid crystal display device, an organic light-emitting display device, or an inorganic light-emitting display device.

In an embodiment, when the electronic device further includes liquid crystals, the electronic device may be a liquid crystal display device. In this case, the light-emitting device acts as (e.g., is) a light source, and the semiconductor nanoparticle 1 is included outside the light-emitting device and the liquid crystal, and may act (e.g., be) as a color conversion member.

In an embodiment, when the interlayer of the light-emitting device includes an emission layer, and the emission layer includes an organic material, the electronic device may be an organic light-emitting display device. In this case, the light-emitting device acts (e.g., is) as a light source, and the semiconductor nanoparticle 1 is included outside the light-emitting device and may act as a color conversion member (e.g., to color convert the light emitted by the light-emitting device).

In an embodiment, when the interlayer of the light-emitting device includes an emission layer and the emission layer includes an inorganic material, for example, the semiconductor nanoparticle 1, the electronic device may be an inorganic light-emitting display device.

The electronic device may further include a thin-film transistor in addition to the light-emitting device as described above. The thin-film transistor may include a source electrode, a drain electrode, and an activation layer, wherein one of the source electrode or the drain electrode may be electrically connected to one of the first electrode or the second electrode of the light-emitting device.

The thin-film transistor may include a gate electrode, a gate insulating film, etc.

The activation layer may include crystalline silicon, amorphous silicon, organic semiconductor, oxide semiconductor, and/or the like.

The electronic device may further include a sealing portion for sealing the light-emitting device. The sealing portion may allow light from the light-emitting device to be extracted to the outside, while concurrently (e.g., simultaneously) preventing or reducing ambient air and/or moisture from penetrating into the light-emitting device. The sealing portion may be a sealing substrate including a transparent glass and/or a plastic substrate. The sealing portion may be a thin-film encapsulation layer including at least one organic layer and/or inorganic layer. When the sealing portion is a thin film encapsulation layer, the electronic device may be flexible.

On the sealing portion, various suitable functional layers may be additionally located depending on the intended use of the electronic device. Non-limiting examples of the functional layers include a color filter, the color conversion layer, a touch screen layer, a polarizing layer, etc. The touch screen layer may be a pressure-sensitive touch screen layer, a capacitive touch screen layer, or an infra-red touch screen layer.

Figure 6:
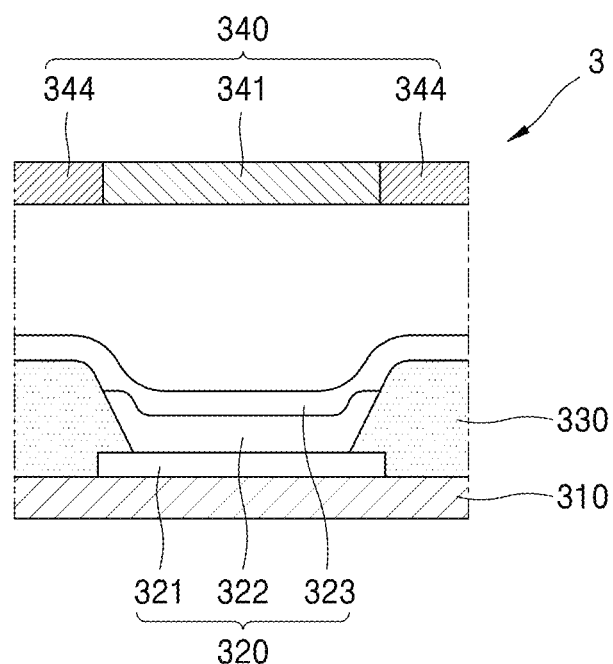
FIGS. 6 and 7 are each a schematic view of a cross-section of an electronic device according to an example.

Hereinafter, an electronic device 3 according to an embodiment will be described with reference to FIG. 6.

The electronic device 3 includes a light-emitting device 320 and a first substrate 340. In some embodiments, the first substrate 340 may be outside, and/or on or above the light-emitting device 320.

The semiconductor nanoparticle 1 may be included outside the light-emitting device 320 (e.g., on a first electrode and/or a second electrode). In an embodiment, the semiconductor nanoparticle 1 may be included in the first substrate 340 positioned outside the light-emitting device 320, and for example, may be on the light-emitting device 320. The first substrate 340 may act as (e.g., be) a color conversion member, and the light-emitting device 320 may act as (e.g., be) a light source.

The light-emitting device 320 includes a first electrode 321, a second electrode 323, and an interlayer 322 located between a first electrode 321 and a second electrode 323.

The electronic device 3 may be an organic light-emitting display device. Accordingly, the light-emitting device 320 may include an organic emission layer in the interlayer 322.

The pixel-defining layer 330 may be located on the first electrode 321. The pixel-defining layer 330 exposes a region of the first electrode 321, and the interlayer 322 may be located in the exposed region of the first electrode 321.

In an embodiment, a region 341 of the first substrate 340 may include the semiconductor nanoparticle 1. In this case, the first substrate 340 may be positioned in a direction in which light emitted from the light-emitting device 320 travels.

The semiconductor nanoparticle 1 may be to absorb a first-color light and to emit a second-color light. Accordingly, the first substrate 340 may be designed to absorb the first-color light and emit one or more suitable color ranges of the second-color light.

In an embodiment, the first substrate 340 may further include a scattering body.

In an embodiment, the first substrate 340 may further include another region that is distinct from the region 341 and does not contain the semiconductor nanoparticle 1, and the other region may transmit the first-color light emitted from a light-emitting device. In an embodiment, only the region 341 includes the semiconductor nanoparticle 1, and the other region may include only the scattering body.

In an embodiment, in the first substrate 340, a light shielding pattern 344 may be further formed between the region 341 and the other region.

In an embodiment, the electronic device 3 may further include a second substrate 310.

Figure 7:
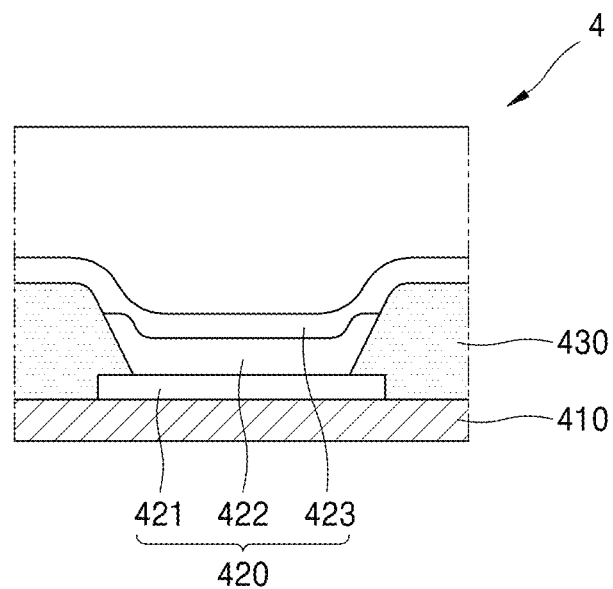

Hereinafter, an electronic device 4 according to an embodiment will be described with reference to FIG. 7.

The electronic device 4 includes a first substrate 410 and a light-emitting device 420.

The light-emitting device 420 includes a first electrode 421, a second electrode 423, and an interlayer 422 located between the first electrode 421 and the second electrode 423.

The semiconductor nanoparticle 1 may be included in the interlayer 422. In an embodiment, the semiconductor nanoparticle 1 may be included in an emission layer included in the interlayer 422.

When an electric field is applied between the first electrode 421 and the second electrode 423, the semiconductor nanoparticle 1 may be to emit visible light. Accordingly, the light-emitting device 420 may be designed to emit a wide color range of wavelengths.

The interlayer 422 may further include an auxiliary layer between the emission layer and the first electrode and/or between the emission layer and the second electrode. The auxiliary layer may directly contact the emission layer. The auxiliary layer may improve the thin-film characteristics of the emission layer.

The interlayer 422 may further include a first charge transport region located between the emission layer and the first electrode, and/or a second charge transport region located between the emission layer and the second electrode.

Hereinafter, a method of manufacturing the semiconductor nanoparticle 1 will be described in more detail.

A method of manufacturing the semiconductor nanoparticle 1 includes: providing a core including a first element; forming a chemical bond between the first element and a second element by adding a first precursor including the second element; and forming a shell including the second element and a third element so as to cover at least a portion of the surface of the core by further adding a second precursor including the third element.

The first element, the second element, and the third element may be different from each other.

For example, a core, a first precursor, and a solvent may be reacted together at a chemical bond forming temperature, for example, at a temperature of 100° C. to 150° C. to form a chemical bond of the first element and the second element.

Thereafter, directly onto the core in which the chemical bond is formed, without separate isolation, a second precursor may be added to form a shell including the second element and the third element.

After the second precursor is added, the obtained mixture may be caused to react at a temperature of about 250° C. to about 350° C., for example, 300° C. to form a shell.

In an embodiment, the core may be obtained by purification and/or separation, or may be formed in situ.

In an embodiment, the core may further include a fourth element, and the core may contain the first element without having a chemical bond with the fourth element (e.g., the first element and the fourth element may not react together to form a compound). When the core satisfies the first element-rich condition (e.g., when the concentration of the first element in the core is sufficiently high), a chemical bond between the first element and the second element may be formed.

In an embodiment, the solvent may be an organic solvent. In an embodiment, the solvent may be trioctylamine, oleylamine, 1-octadecene (ODE), or the like.

Details of the method of manufacturing the semiconductor nanoparticles may be recognized by those skilled in the art with reference to Examples to be described later.

Hereinafter, semiconductor nanoparticles according to an embodiment will be described in more detail in Examples.

EXAMPLES

Example 1

In a 250 mL reactor, 50 mg of InP core (the atomic ratio of In:P in the InP core was 1.17:1) and 10 mL of 1-octadecene were added, and a condition of 110° C. and an atmosphere of 100 mTorr or less was created. Then, nitrogen was injected to change the reactor to have a nitrogen atmosphere therein, and then 0.5 mmol of trioctylphosphine selenide (TOPSe) was added and reacted for 10 minutes. Then, the temperature of the reactor was increased to 310° C., 1 mmol of zinc oleate was added, and the reaction was performed for 10 minutes to form a ZnSe shell, thereby obtaining a semiconductor nanoparticle of Example 1.

Figure 3A:
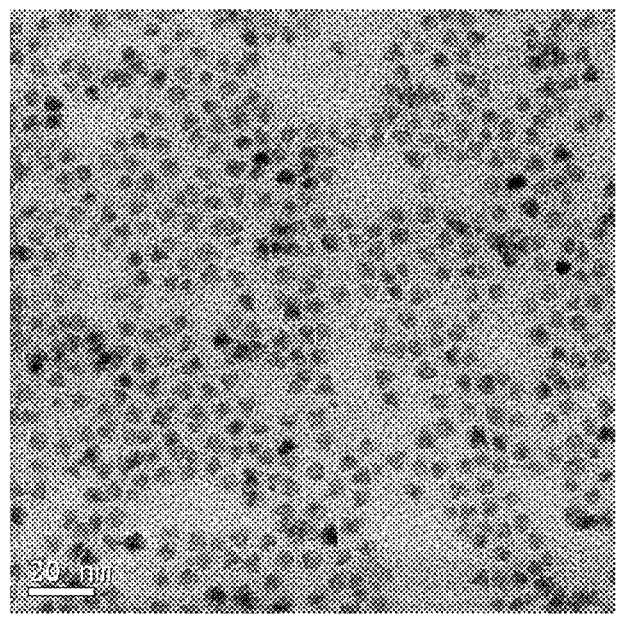
FIGS. 3A-3D show transmission electron microscope (TEM) images of Example 1.

The semiconductor nanoparticle of Example 1 includes an InP core and a ZnSe shell. FIG. 3A is a transmission electron microscope (TEM) image of the semiconductor nanoparticle of Example 1.

Example 2

A semiconductor nanoparticle of Example 2 was obtained utilizing substantially the same method as the method of manufacturing the semiconductor nanoparticle of Example 1, except that 3 mmol of zinc oleate and 1.5 mmol of TOPSe were utilized.

Figure 3B:
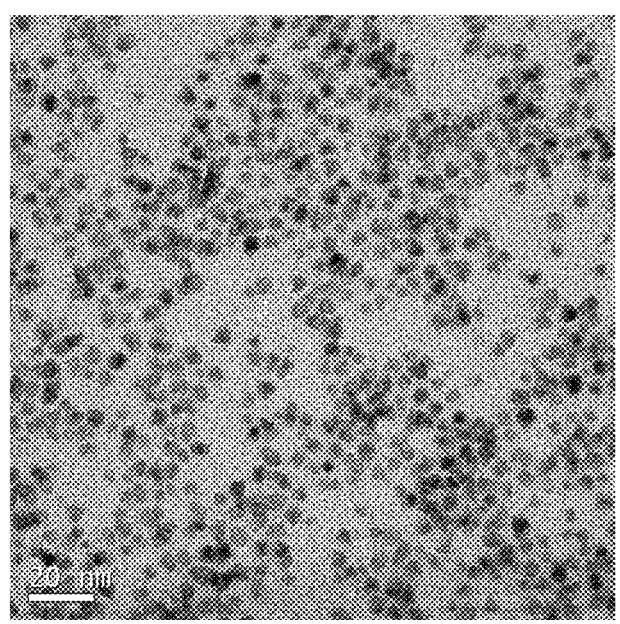

The semiconductor nanoparticle of Example 2 includes an InP core and a ZnSe shell. FIG. 3B is a transmission electron microscope (TEM) image of the semiconductor nanoparticle of Example 1.

Comparative Example 1

In a 250 mL reactor, 50 mg of the InP core, which is substantially the same as utilized in Example 1, and 10 mL of 1-octadecene as utilized in Example 1 were added, and then, a condition of 110° C. and an atmosphere of 100 mTorr or less was created. Then, nitrogen was injected to change the inside of the reactor into a nitrogen atmosphere, and then 1 mmol of zinc oleate was added and reacted for 10 minutes. Then, the temperature of the reactor was increased to 310° C., 0.5 mmol of TOPSe was added, and the reaction was performed for 10 minutes to form a ZnSe shell, thereby obtaining a semiconductor nanoparticle of Example 1.

Figure 3C:
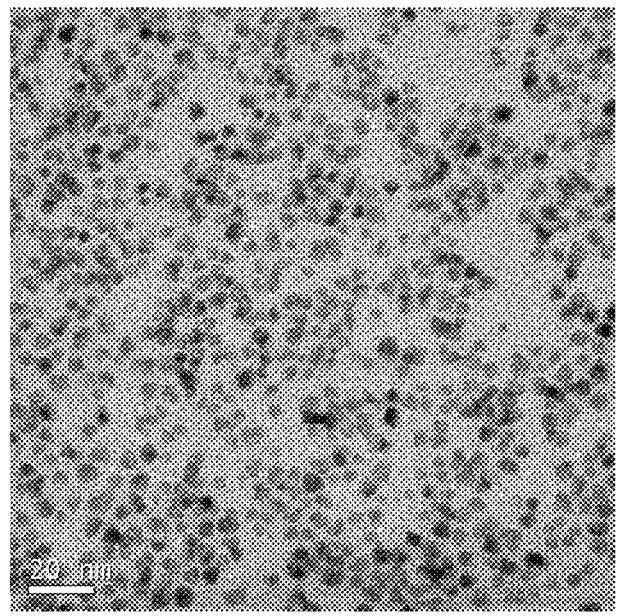

The semiconductor nanoparticle of Comparative Example 1 includes an InP core and a ZnSe shell. FIG. 3C is a transmission electron microscope (TEM) image of the semiconductor nanoparticle of Comparative Example 1.

Comparative Example 2

A semiconductor nanoparticle of Comparative Example 2 was obtained utilizing substantially the same method as the method of manufacturing the semiconductor nanoparticle of Example 2, except that 3 mmol of zinc oleate and 1.5 mmol of TOPSe were utilized.

Figure 3D:
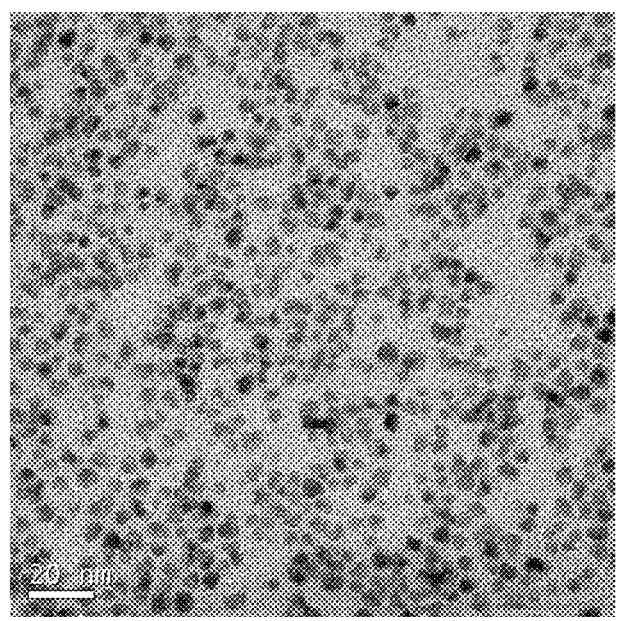

The semiconductor nanoparticle of Comparative Example 2 includes an InP core and a ZnSe shell. FIG. 3D is a TEM image of the semiconductor nanoparticle of Comparative Example 2.

Evaluation Example 1: X-Ray Photoelectron Spectroscopy (XPS) Analysis of the Interface Between a Core and a Shell With respect to each of Example 1 and Comparative Example 1, XPS element analysis was performed on the interface between a core and a shell by utilizing a Quantum 2000 (Physical Electronics) at an acceleration voltage of 0.5 keV to 15 keV, a power of 300 W, a minimum analysis region of 200 μm×200 μm, and at a sputter rate of 0.1 nm/min. The results are shown in FIG. 4.

Figure 4:
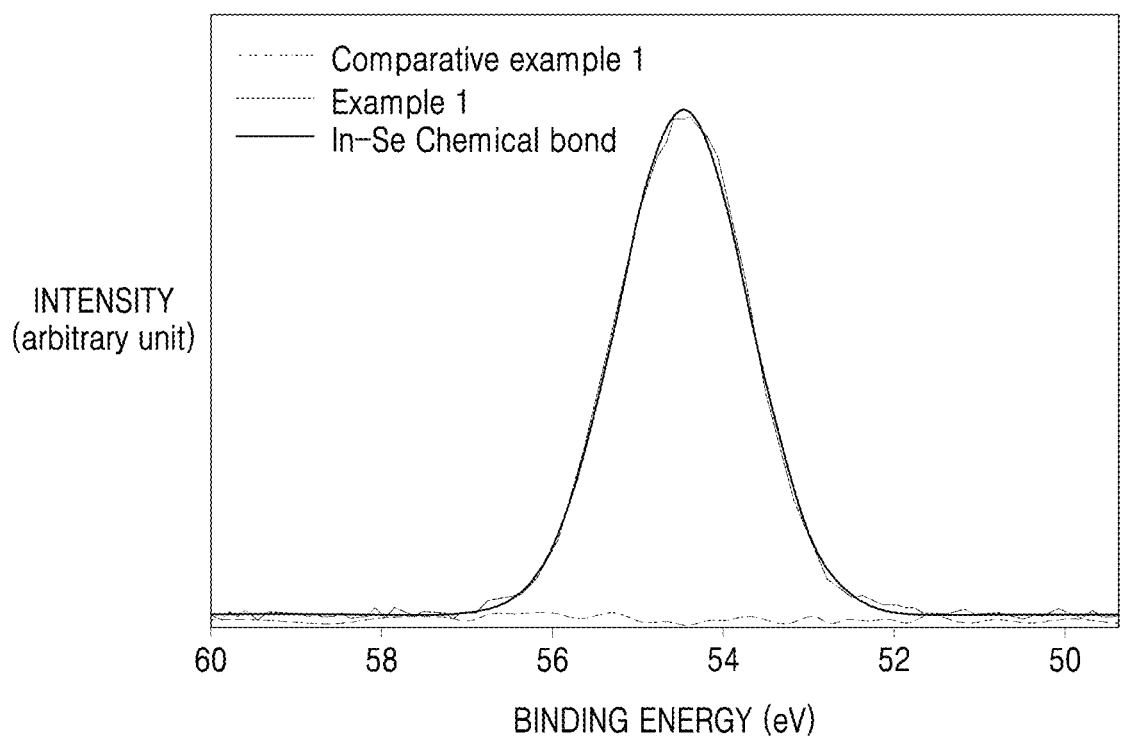
FIG. 4 is a diagram showing the X-ray photoelectron spectroscopy (XPS) spectrum obtained at the interface between a core and a shell of each of Example 1 and Comparative Example 1.

Referring to FIG. 4, in the case of Example 1, a graph that is similar to the characteristic graph (peak) of In—Se bonding was obtained, and in the case of Comparative Example 1, a graph that is completely different from the characteristic graph of In—Se bonding was obtained. From these results, it was confirmed that an In—Se chemical bond was formed in Example 1, and an In—Se chemical bond was not formed in Comparative Example 1.

Evaluation Example 2: X-Ray Photoelectron Spectroscopy (XPS) Analysis

With respect to each of Example 1 and Comparative Example 1, XPS element analysis was performed utilizing a Quantum 2000 (Physical Electronics) at an acceleration voltage of 0.5 keV to 15 keV, a power of 300 W, a minimum analysis region of 200 μm×200 μm, and at a sputter rate of 0.1 nm/min. The results are shown in FIG. 5.

Figure 5:
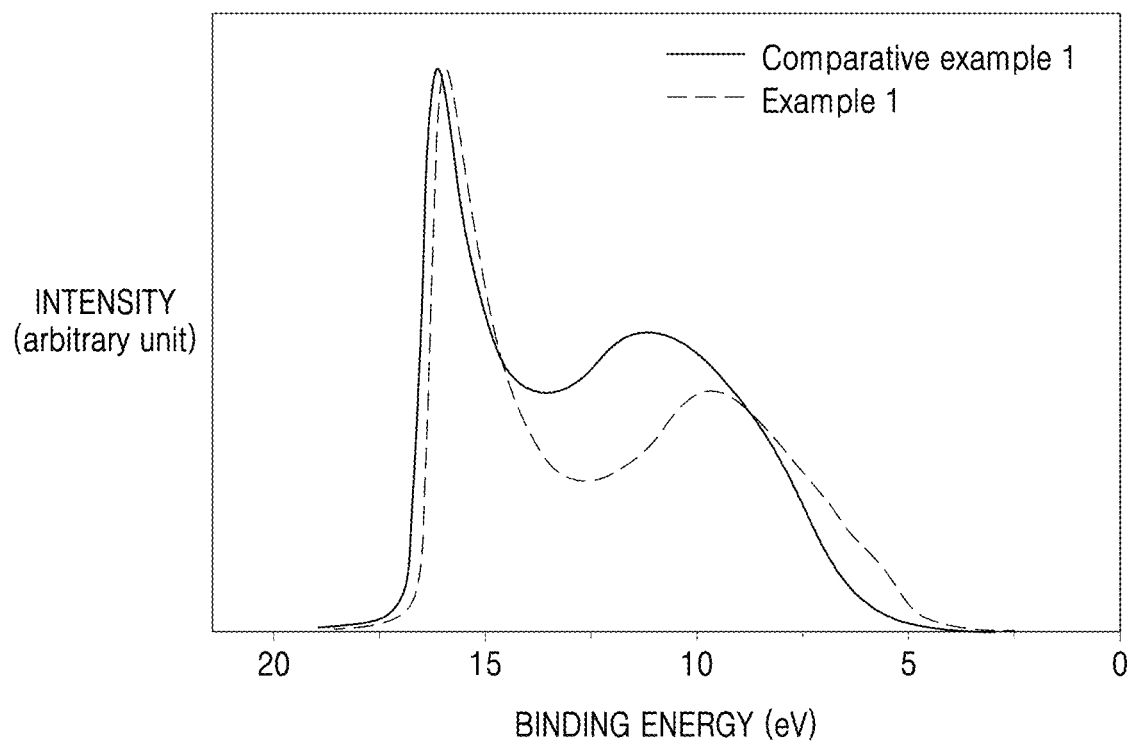
FIG. 5 shows overlaid XPS spectra of Example 1 and Comparative Example 1.

Referring to FIG. 5, the graphs of Example 1 and Comparative Example 1 show almost similar patterns, from which it can be confirmed that the chemical compositions of Example 1 and Comparative Example 1 are substantially the same.

Evaluation Example 3: Ultraviolet Photoelectron Spectroscopy (UPS) Analysis

UPS analysis was performed with respect to Example 1 and Comparative Example 1. UPS measurements were performed in an ultra-high vacuum (UHV) chamber by utilizing a home light emission spectroscopy system including an ultraviolet source (VUV 5000) and an electron analyzer (SES-100). At this time, the ultraviolet source was a 40.8 eV of He II source which is controlled or selected utilizing a monochromator.

From the UPS data of Example 1 and Comparative Example 1, it was confirmed that the VBM of Example 1 was −6.23 eV and the VBM of Comparative Example 1 was −5.98 eV.

From the data of Evaluation Example 2 and Evaluation Example 3, it was confirmed that the semiconductor nanoparticles of Example 1 and Comparative Example 1 having substantially the same chemical composition had different VBMs. Through this, the possibility of a new manufacturing method that is capable of controlling the energy level of semiconductor nanoparticles, was confirmed.

The energy levels of semiconductor nanoparticles are controlled or selected by controlling the interface characteristics between a core and a shell. Accordingly, charge injection characteristics of semiconductor nanoparticles can be effectively controlled or selected. Also, even when the surrounding environment changes, the energy levels of the semiconductor nanoparticles may not substantially change. Accordingly, an electronic device including the semiconductor nanoparticles may have improved efficiency and/or lifespan.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope of the disclosure, as defined by the following claims and equivalents thereof.

What is claimed is:

1. A semiconductor nanoparticle comprising:
   a core comprising a first element, and
   a shell covering at least a portion of a surface of the core and comprising a second element and a third element,
   wherein the first element, the second element, and the third element are different from each other,
   the first element in the core and the second element in the shell are chemically bonded to each other across an interface between the core and the shell, and
   wherein the core and the shell do not share a common element, and
   the interior of the core does not encompass the chemical bond across the interface between the different first and second elements.

2. The semiconductor nanoparticle of claim 1, wherein:
   the shell comprises a first region and a second region, the first region is between the core and the second region, and an atom % of the third element in the first region is less than an atom % of the third element in the second region.

3. The semiconductor nanoparticle of claim 1, wherein:
the core further comprises a fourth element, and
the first element is not chemically bonded to the fourth element.

4. The semiconductor nanoparticle of claim 3, wherein an atomic ratio of the first element to the fourth element is 0.5 to 2.0.

5. The semiconductor nanoparticle of claim 1, wherein:
the core comprises a third region and a fourth region,
the third region is between the shell and the fourth region, and
an atom % of the first element in the third region is greater than the atom % of the first element in the fourth region.

6. The semiconductor nanoparticle of claim 1, wherein an absolute value of an oxidation number of the first element and an absolute value of an oxidation number of the second element are different from each other.

7. The semiconductor nanoparticle of claim 6, wherein one selected from the oxidation number of the first element and the oxidation number of the second element is a negative value, and the other is a positive value.

8. The semiconductor nanoparticle of claim 1, wherein the first element and the second element are each independently a Group 12 element, a Group 13 element, a Group 14 element, a Group 15 element, or a Group 16 element.

9. The semiconductor nanoparticle of claim 1, wherein the chemical bond is a chemical bond of a Group 12 element and a Group 16 element, a chemical bond of a Group 13 element and a Group 15 element, a chemical bond of a Group 13 element and a Group 16 element, a chemical bond of a Group 14 element and a Group 12 element, a chemical bond of a Group 14 element and a Group 13 element, a chemical bond of a Group 14 element and a Group 16 element, a chemical bond of a Group 14 element and a Group 15 element, or a combination thereof.

10. The semiconductor nanoparticle of claim 1, wherein:
the core comprises InP,
the shell comprises ZnSe, and
a chemical bond between the first element and the second element is a chemical bond between In and Se.

11. The semiconductor nanoparticle of claim 1, wherein:
a band gap of the core is about 1.35 eV to about 3.10 eV, and
a band gap of the shell is about 1.1 eV to about 3.68 eV.

12. An electronic device comprising:
a light-emitting device comprising a first electrode, a second electrode, and an interlayer between the first electrode and the second electrode; and
the semiconductor nanoparticle of claim 1 with the light-emitting device.

13. The electronic device of claim 12, further comprising a first substrate on the light-emitting device,
wherein the first substrate comprises the semiconductor nanoparticle.

14. The electronic device of claim 13, wherein:
a first region of the first substrate comprises the semiconductor nanoparticle, and
the semiconductor nanoparticle is to absorb first-color light and emit second-color light.

15. The electronic device of claim 14, wherein:
the first substrate further comprises a second region that is distinct from the first region, and
the second region comprises a scattering body, but does not contain the semiconductor nanoparticle.

16. The electronic device of claim 13, wherein the first substrate is positioned in a travel direction of light emitted from the light-emitting device.

17. The electronic device of claim 12, wherein the interlayer comprises the semiconductor nanoparticle.

18. The electronic device of claim 17, wherein the semiconductor nanoparticle is to emit visible light in response to an electric field applied to the first electrode and the second electrode.

19. A method of manufacturing a semiconductor nanoparticle, the method comprising:
providing a core comprising a first element;
forming a chemical bond between the first element and a second element by adding a first precursor comprising the second element; and
forming a shell comprising the second element and a third element to cover at least a portion of a surface of the core by adding a second precursor comprising the third element,
wherein the first element, the second element, and the third element are different from each other,
wherein the chemical bond between the first element in the core and the second element in the shell is across an interface between the core and the shell, and
wherein the core and the shell do not share a common element, and
the interior of the core does not encompass the chemical bond across the interface between the different first and second elements.

20. The method of claim 19, wherein:
the core further comprises a fourth element, and
the first element is not chemically bonded to the fourth element.

* * * * *